United States Patent
Matsuura

(10) Patent No.: US 6,570,725 B1
(45) Date of Patent: May 27, 2003

(54) DRIVE CIRCUIT FOR MAGNETIC HEAD AND WINDING CONFIGURATION OF MAGNETIC HEAD SUITABLE FOR THE DRIVE CIRCUIT

(75) Inventor: Michio Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/564,252

(22) Filed: May 4, 2000

(30) Foreign Application Priority Data

Jul. 12, 1999  (JP) ............................. 11-197393

(51) Int. Cl.$^7$ .............................. G11B 5/09; G11B 5/02; G11B 5/17
(52) U.S. Cl. .............................. 360/46; 360/67; 360/123
(58) Field of Search .............................. 360/46, 59, 67, 360/123; 369/13

(56) References Cited

U.S. PATENT DOCUMENTS

| 4,249,219 A | 2/1981 | Aoi et al. ............... 360/46 |
| 5,229,902 A | 7/1993 | Zucker et al. ............ 360/114 |
| 5,991,242 A | 11/1999 | Ishii ..................... 369/13 |

FOREIGN PATENT DOCUMENTS

| EP | 251 561 | 1/1988 |
| EP | 716 418 | 6/1996 |
| JP | 52046807 | 4/1977 |
| JP | 63094406 | 4/1988 |
| JP | 1130302 | 5/1989 |
| JP | 2244877 | 9/1990 |
| JP | 4-143901 | 5/1992 |
| JP | 4-219651 | 8/1992 |
| JP | 5225501 | 9/1993 |
| JP | 7182717 | 7/1995 |
| JP | 8045008 | 2/1996 |
| JP | 8096435 | 4/1996 |
| JP | 11-16224 | 1/1999 |
| JP | 11-86203 | 3/1999 |

Primary Examiner—Regina N. Holder
(74) Attorney, Agent, or Firm—Greer, Burns & Crain, Ltd.

(57) ABSTRACT

The magnetizing control signal MAGCH becomes the high level if there is no magnetic reversal during a period of a predetermined number of clocks and becomes the low level if there is a magnetic reversal. If the magnetizing control signal MAGCH is the low level, the high voltage VH is applied to the center tap of the bifilar winding 31 of the magnetic head via the transistor 39. The transistors 40, 41 or the transistors 42, 43 are turned on in accordance with the write data signal DATA, *DATA. Therefore, the magnetizing current flows through one of the winding elements 31a and 31b. If the magnetizing control signal MAGCH is the high level, the transistors 46, 41 or the transistors 48, 43 are turned on in accordance with the write data signal DATA, *DATA. Therefore, the magnetizing current flows from the low voltage VL to both the winding elements 31a and 31b.

16 Claims, 10 Drawing Sheets

DRIVE CIRCUIT FOR MAGNETIC HEAD AND WINDING CONFIGURATION OF MAGNETIC HEAD SUITABLE FOR THE DRIVE CIRCUIT

BACKGROUND OF THE INVENTION

1. Field of the Invention

The present invention relates to a winding configuration of a magnetic head used for a magnetic field modulation type magneto-optical disk drive and a drive circuit for the magnetic head.

2. Description of the Prior Art

A magnetic field modulation type magneto-optical disk drive has a higher recording density than other optical recording media and can transmit data in a high speed, so it is regarded as a main stream of various recording media in digital information society. In order to utilize the superior transmission speed, it is important that a magnetic reversal speed of a magnetic head becomes fast.

A typical magnetic head and a drive circuit for the same in the prior art are disclosed in Japanese unexamined patent publication No. 52-46807 for example, in which a magnetic head having a bifilar winding is driven by a constant-current circuit.

FIG. 1 shows a schematic structure of a magnetic head having a bifilar winding. FIG. 2 shows the winding configuration of the magnetic head. This magnetic head has an E-type core 11 and windings L1 and L2 wound on the core 11. The winding L1 and L2 are wound in the same winding direction. In other words, the entire winding (L1+L2) from the tap a to the tap c has a center tap b.

Using the magnetic head having the above-mentioned bifilar winding, the polarity of the magnetic field generated by the magnetic head can be switched easily without changing the direction of the current flowing through the constant-current circuit. In FIG. 1 for example, the current always flows into the center tap b and flows out of tap a or c. One of the current paths connected to the taps a and b is turned on selectively so that one of the windings L1 and L2 is magnetized selectively, and the polarity of the magnetic field generated by the magnetic head is switched. This switching of the current path can be performed by using a common emitter type drive circuit that enables high speed switching. The common emitter type drive circuit has been used widely in a drive circuit for a magnetic core memory device, for example.

However, this drive circuit for a magnetic head having a bifilar winding cannot use the winding effectively since only one of the windings L1 and L2 is used for generating a stationary magnetic field during the period without the magnetic reversal. In addition, a power consumption of the drive circuit is large.

A number of methods for reducing the power consumption of the drive circuit are proposed. For example, an H-type switching circuit is disclosed in Japanese unexamined patent publication No. 63-94406, or a resonance type circuit is disclosed in Japanese unexamined patent publication No. 1-130302. However, a limit of performance about a switching delay of a semiconductor device and a limit of operational frequency appeared, and the current drive circuit is receiving an attention again.

The differential di/dt of a current flowing through the winding of the magnetic head is proportional to a voltage E applied to the winding as shown in the following equation.

$$di/dt = E/L$$

Here, L is an inductance of the winding.

Therefore, for increasing the differential di/dt so as to switch the magnetic field quickly, it is necessary to increase the voltage E that is applied to the winding. However, during the period without the magnetic reversal, it is enough to maintain a direct current flowing through the winding. Namely, if the voltage E that is applied to the winding is increased too largely, the waste of power consumption increases in the constant-current circuit during the period without the magnetic reversal.

A method for avoiding this waste of power consumption is disclosed in Japanese unexamined patent publication No. 8-45008 or No. 8-96435, in which the voltage is raised only when switching the current (i.e., when the magnetic field is reversed) and otherwise, a relatively lower voltage is applied to the winding. However, this method also cannot decrease the power consumption of the constant-current circuit sufficiently, and a further improvement is desired.

There is another method proposed in Japanese unexamined patent publication No. 7-182717 or No. 5-225501, in which the winding is divided into several elements so as to generate magnetic fields in parallel. However, even if the parallel winding elements can bring an effect of a high speed magnetic reversal, it does not contribute the decrease of the power consumption of the entire circuit including the constant-current circuit.

SUMMARY OF THE INVENTION

The object of the present invention is to provide a drive circuit that can reduce the power consumption in the constant-current drive circuit. Another object of the present invention is to provide a winding configuration of the magnetic head that is suitable for the drive circuit.

A drive circuit according to the present invention drives a magnetic head that has a bifilar winding with a center tap and is used for a magneto-optical disk drive.

According to a first aspect, the drive circuit applies a first magnetizing voltage between the center tap and one of the winding ends of the bifilar winding so as to magnetize only half of the winding during a first period in which a magnetic reversal occurs, and applies a second magnetizing voltage between the winding ends of the bifilar winding so as to magnetize the entire winding during a second period in which a magnetic reversal does not occur. Thus, the drive circuit can save the power consumption by reducing the magnetizing current during the period without a magnetic reversal.

Preferably, the second magnetizing voltage applied to the winding ends of the bifilar winding during the second period is set lower than the first magnetizing voltage applied to the center tap and one of the winding ends of the bifilar winding during the first period. Thus, the power consumption is further reduced. In addition, the switching from the second magnetizing voltage to the first magnetizing voltage is preferably performed before the magnetic reversal, so as to enable a high-speed magnetic reversal.

As a concrete configuration, each of the winding ends of the bifilar winding is connected to a magnetizing current path that includes two current paths connected in parallel, each of the two current paths has a switching device, and the switching devices are controlled so that the magnetizing current can flow through the two current paths during the first period in which a magnetic reversal occurs and can flow through one of the two current paths during the second period in which a magnetic reversal does not occur. Thus, the circuit that can perform the high speed magnetic reversal is simplified.

According to a second aspect, the drive circuit applies a first magnetizing voltage between the center tap and one of the winding ends of the bifilar winding so as to magnetize only half of the winding during the data writing period with a magnetic reversal, and applies second magnetizing voltage between the winding ends of the bifilar winding so as to magnetize the entire winding during the data reading period. In a magneto-optical disk drive using a so-called magnetic super resolution (MSR) recording medium, a constant magnetic field has to be applied to the recording medium when reading data from the recording medium. In this case, using the above-mentioned drive circuit for the magnetic head, the power consumption during the data reading period can be reduced.

A first winding configuration of the magnetic head according to the present invention has a bifilar winding with a center tap and an additional winding element connected to each of the winding ends of the bifilar winding, so that four winding elements and five taps including the center tap and two end taps constitute the whole winding of the magnetic head.

According to a first configuration of the drive circuit using the above-mentioned first winding configuration of the magnetic head, the drive circuit magnetizes only the inner bifilar winding of the magnetic head during a first period in which a magnetic reversal occurs, and magnetizes the entire winding including the additional outer winding elements of the magnetic head during a second period in which a magnetic reversal does not occur. Thus, the magnetizing current is reduced during the period without a magnetic reversal.

Preferably, a second magnetizing voltage applied to the inner bifilar winding and the additional outer winding elements of the magnetic head during the second period is set lower than a first magnetizing voltage applied to the inner bifilar winding of the magnetic head during the first period. Thus, the power consumption can be further reduced. It is also preferable to perform the switching from the second magnetizing voltage to the first magnetizing voltage before the magnetic reversal.

According to a second configuration of the drive circuit using the above-mentioned first winding configuration of the magnetic head, the drive circuit magnetizes only the inner bifilar winding during the data writing period with a magnetic reversal, and magnetizes the entire winding including the additional outer winding elements during the data reading period.

A second winding configuration of the magnetic head according to the present invention has a bifilar winding with a center tap and an additional winding provided separately from the bifilar winding. The number of turns of the additional winding is larger than that of half of the bifilar winding.

According to a first configuration of the drive circuit using the above-mentioned second winding configuration of the magnetic head, the drive circuit magnetizes the bifilar winding of the magnetic head during a first period in which a magnetic reversal occurs, and magnetizes the additional separate winding during a second period in which a magnetic reversal does not occur. Thus, the magnetizing current is reduced during the period without a magnetic reversal so that the power consumption can be reduced.

Preferably, a second magnetizing voltage applied to the additional separate winding of the magnetic head during the second period is set lower than a first magnetizing voltage applied to the bifilar winding of the magnetic head during the first period. Thus, the power consumption can be reduced further. It is also preferable to perform the switching from the second magnetizing voltage to the first magnetizing voltage before the magnetic reversal.

According to a second configuration of the drive circuit using the above-mentioned second winding configuration of the magnetic head, the drive circuit magnetizes the bifilar winding of the magnetic head during the data writing period with a magnetic reversal, and magnetizes the additional separate winding during the data reading period.

Another configuration of the drive circuit comprises a first drive circuit for magnetizing only half of the winding selectively by supplying a first magnetizing current between the center tap of the bifilar winding and one of the winding ends, a second drive circuit for magnetizing the entire winding by supplying second magnetizing currents to the winding ends of the bifilar winding selectively, the second magnetizing currents being smaller than the first magnetizing current and having opposite directions from each other, and a circuit for controlling the first and the second drive circuits selectively in accordance with bit pattern of a binary signal to be recorded.

DESCRIPTION OF THE PREFERRED EMBODIMENTS

Hereinafter, the present invention will be explained in detail with reference to embodiments and accompanied drawings.

First Embodiment

Figure 1:
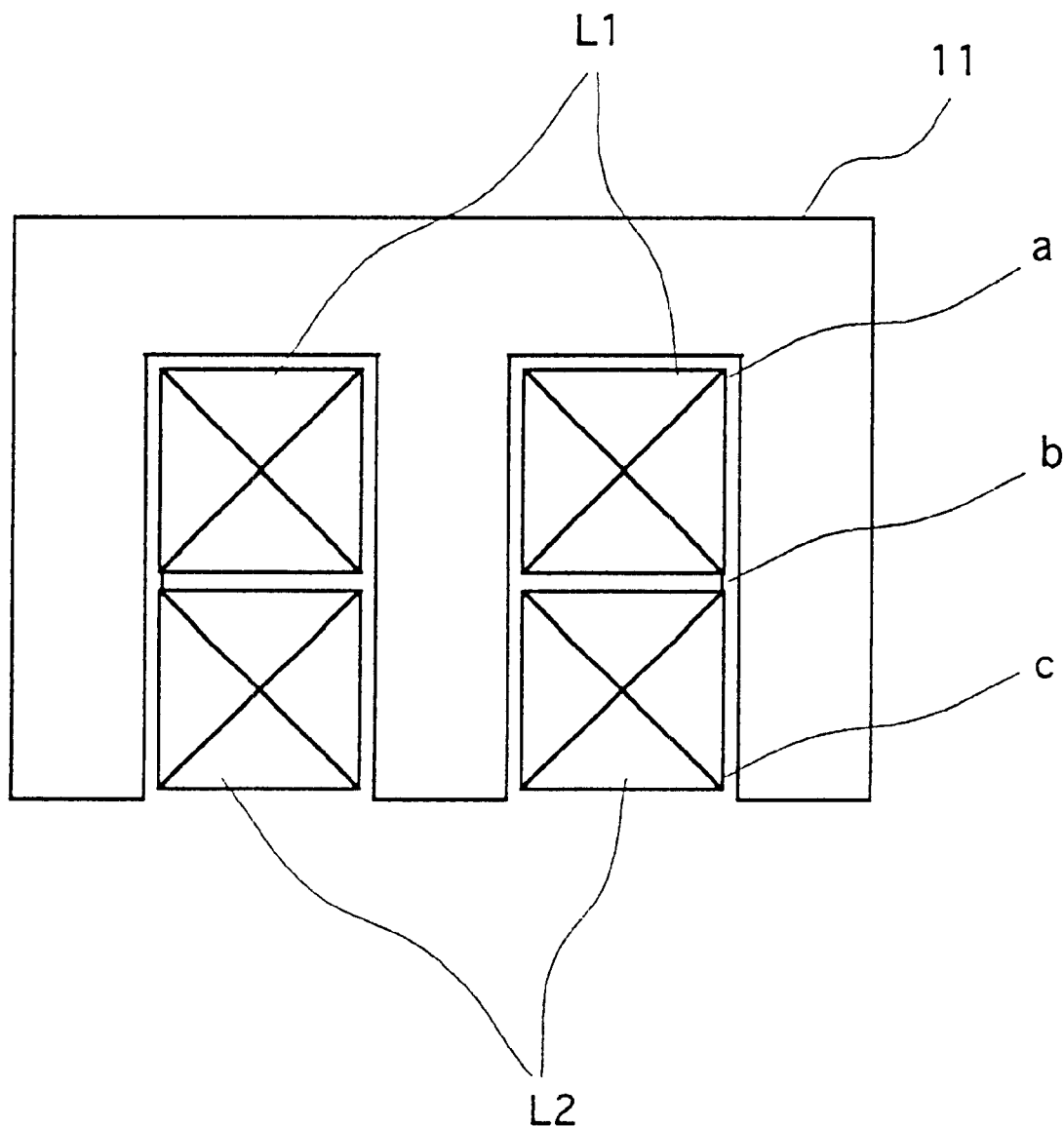
FIG. 1 shows a schematic structure of a magnetic head having a bifilar winding.
Figure 2:
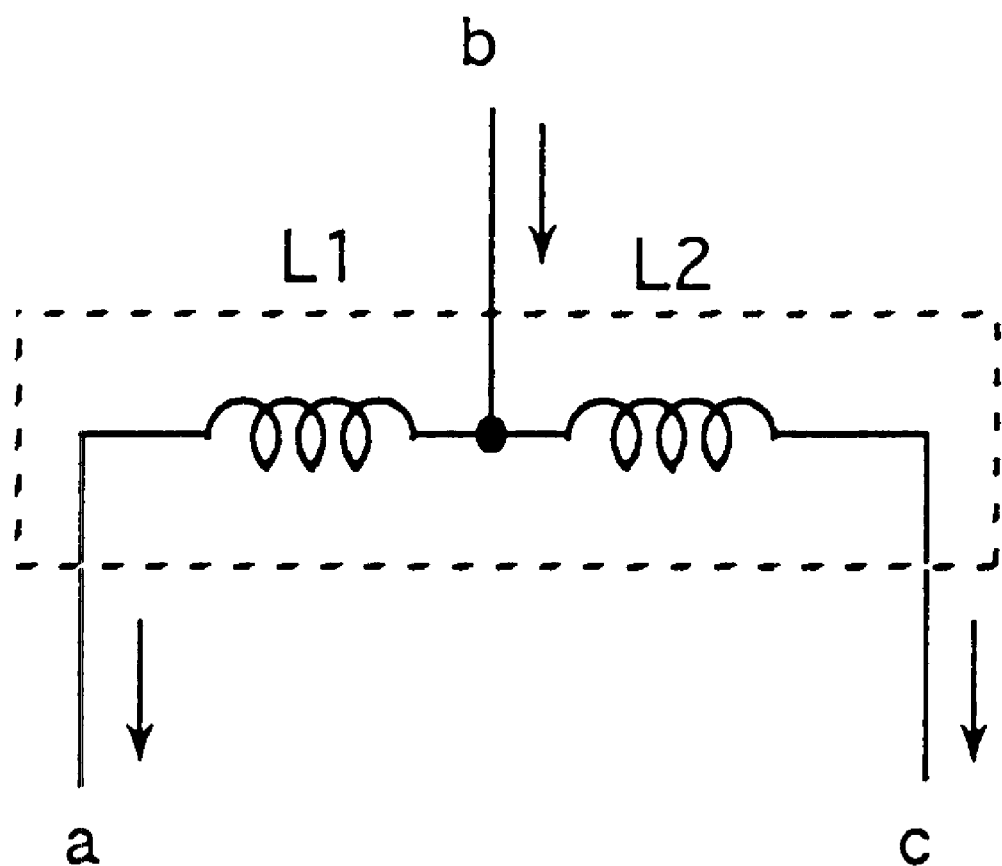
FIG. 2 shows the winding configuration of the magnetic head.
Figure 3:
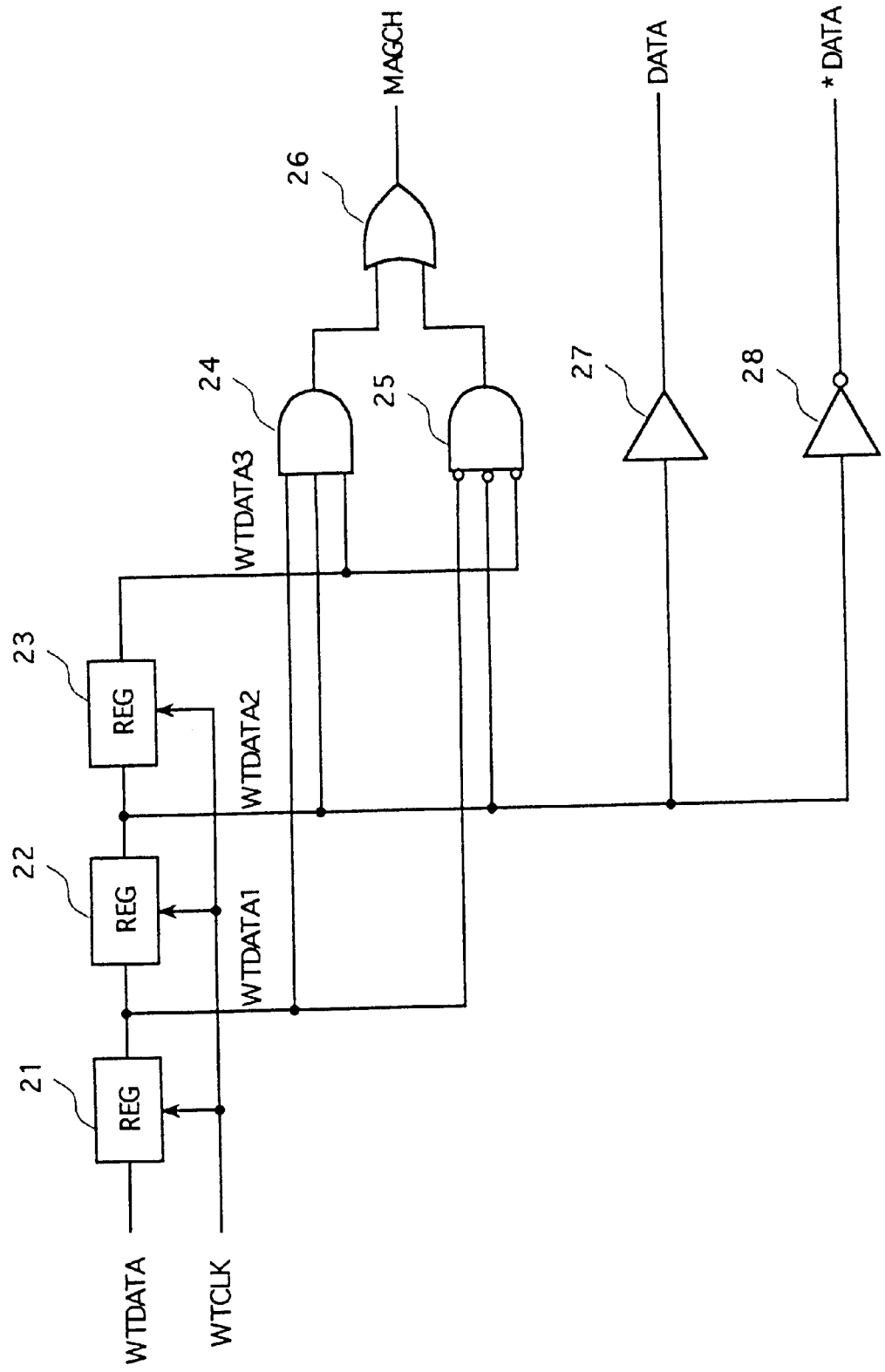
FIG. 3 shows a front part of a drive circuit for the magnetic head according to a first embodiment of the present invention.
Figure 4:
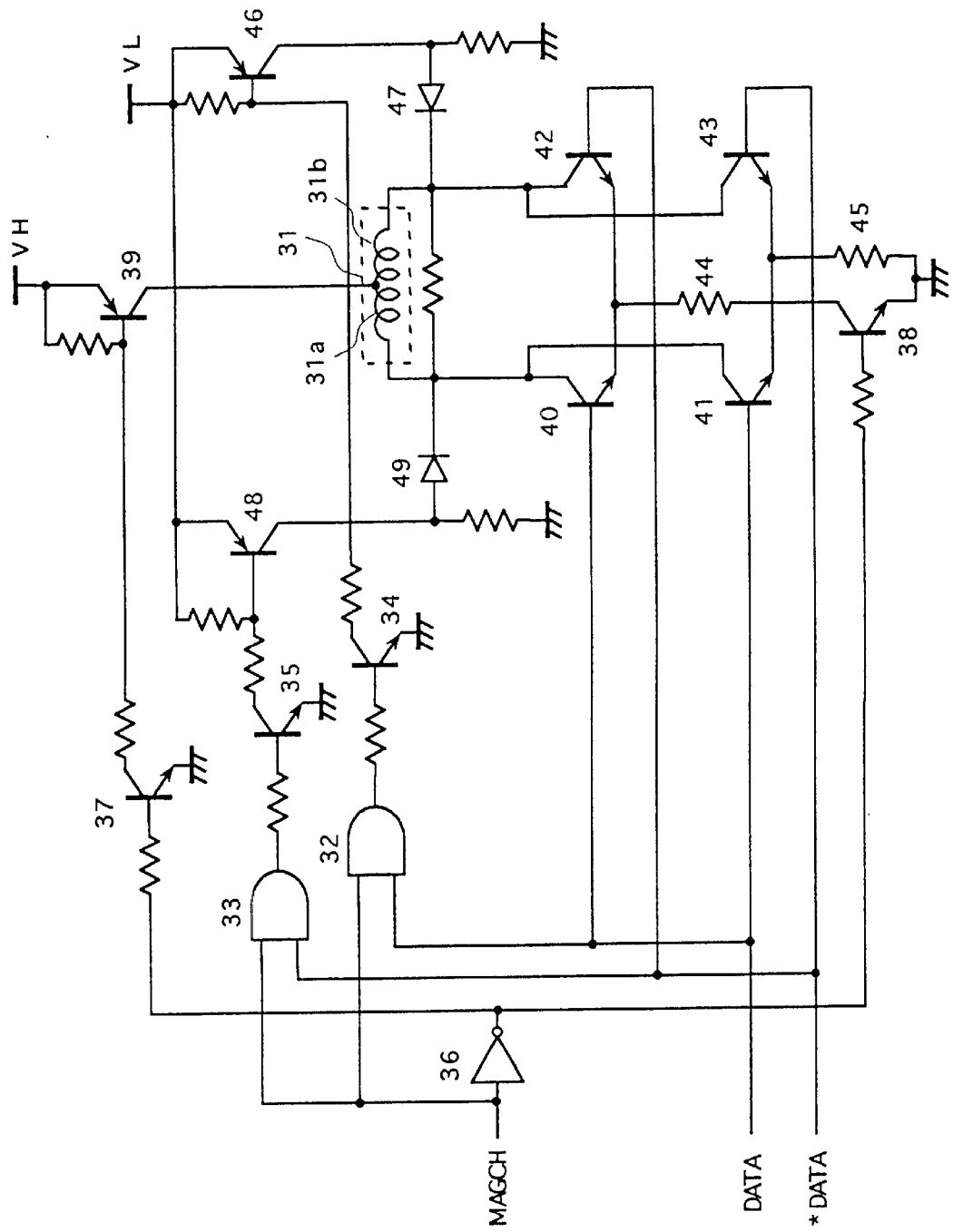
FIG. 4 shows a rear part of the drive circuit for the magnetic head according to the first embodiment of the present invention.
Figure 5:
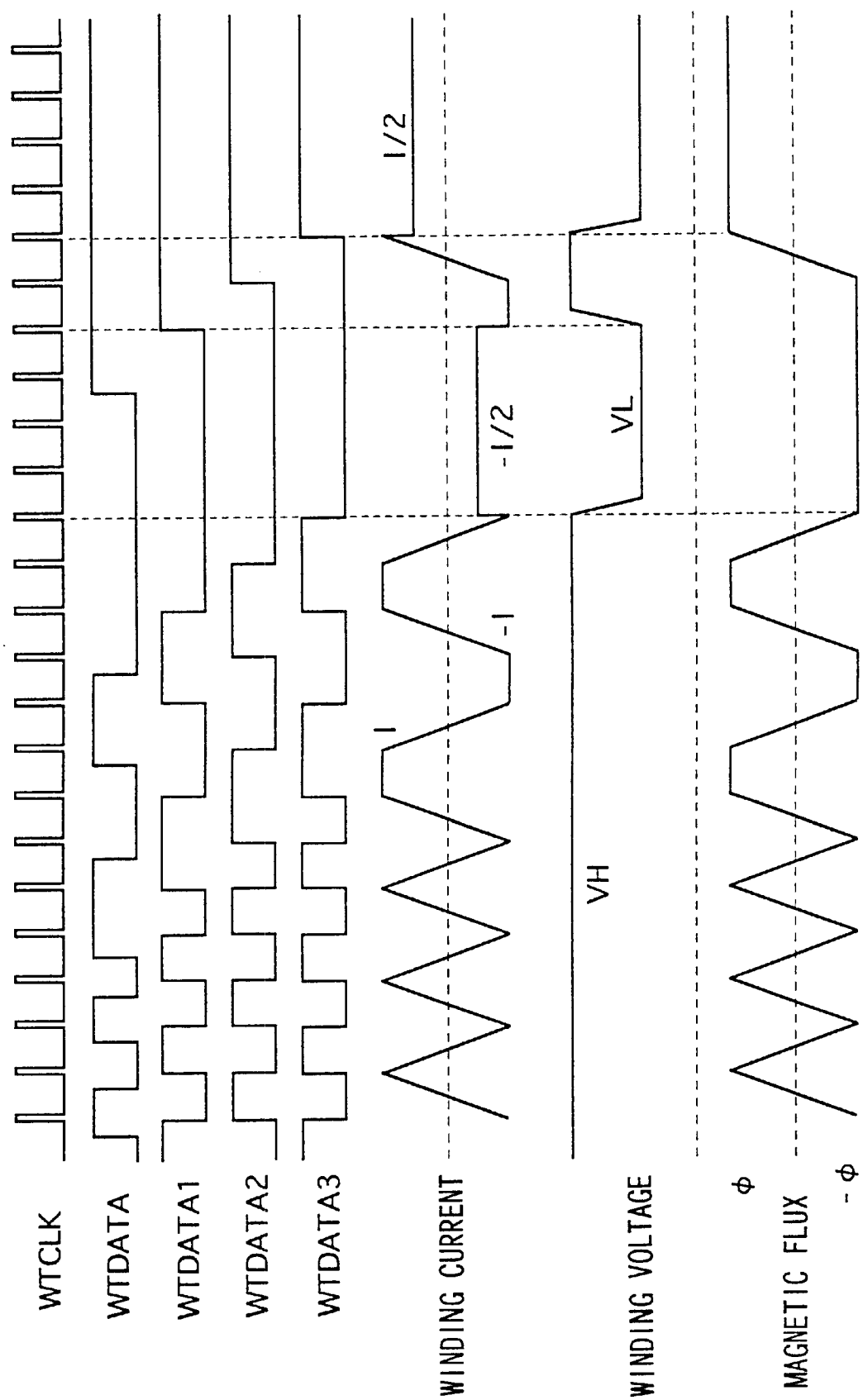
FIG. 5 shows waveforms of the signals in the drive circuit for the magnetic head according to the first embodiment of the present invention.

FIGS. 3 and 4 are circuit diagrams of a drive circuit for a magnetic head according to a first embodiment of the present invention. The signal waveforms in this drive circuit for the magnetic head are shown in FIG. 5. FIG. 3 shows a front part of the drive circuit for the magnetic head. This part generates a write control signal DATA for controlling the switching of the current that flows through the winding of the magnetic head in accordance with the write data, the inverted write control signal *DATA and a magnetizing control signal MAGCH indicating the presence or absence of the magnetic reversal. The prefix "*" of a signal name (e.g., DATA) indicates the inverted logic, hereinafter. FIG. 4 shows a rear part of the drive circuit for the magnetic head. This part switches the current that flows through the winding of the magnetic head in accordance with the signals DATA, *DATA, and MAGCH given by the front part of the drive circuit.

First, the circuit of FIG. 3 will be explained. Three registers 21–23 constitute a shift register, and each register 21–23 is supplied with a write clock signal WTCLK. The first register 21 that is provided with a write data signal WTDATA outputs a first write data signal WTDATA1 in synchronization with the write clock signal WTCLK. This signal is given to the second register 22, which outputs a write data signal WTDATA2 delayed from the write data signal WTDATA1 by one write clock. The signal is given to the third register 23, which output a write data signal WTDATA3 delayed from the write data signal WTDATA1 by two write clocks. The waveforms of these signals are shown in FIG. 5.

Three write data signals WTDATA1, WTDATA2 and WTDATA3 are given to an AND gate 24, which outputs an AND signal of these signals. In addition, an AND operation of inverted signals of three write data signals WTDATA1, WTDATA2 and WTDATA3 is preformed by an AND gate 25.

An OR operation of the output signal of the AND gate 24 and the output signal of the AND gate 25 is performed by an OR gate 26. The result is outputted as a magnetizing control signal MAGCH indicating the presence or absence of the magnetic reversal. Therefore, if the write data WTDATA keeps its high level or low level over three-write-clock period, the magnetizing control signal MAGCH becomes the high level, otherwise the signal MAGCH becomes the low level. The signal MAGCH indicates the absence of the magnetic reversal by its high level and indicates the presence of the magnetic reversal by its low level.

The write data WTDATA2 is outputted via a buffer 27 as write control signal DATA, and is outputted as an inverted write control signal *DATA via an inverter 28.

The circuit of FIG. 4 controls the direction and the amplitude of the current that flows through the winding 31 of the magnetic head in accordance with the three signals MAGCH, DATA and *DATA given by the circuit of FIG. 3. With reference to signal waveforms shown in FIG. 5, the operation of the circuit shown in FIG. 4 will be explained. The winding 31 of the magnetic head is a bifilar winding with a center tap.

First, the operation will be explained for when the magnetizing control signal MAGCH is the low level, i.e., when the magnetic reversal appears over the three-write-clock period. In this case, transistors 34 and 35 are turned off since the outputs of the AND gates 32 and 33 are both the low level. On the contrary, the transistors 37 and 38 are turned on since the bases of the transistors 37 and 38 are supplied with an inverted signal of the magnetizing control signal MAGCH by the inverter 36. When the transistor 37 is turned on, a transistor 39 is also turned on, so that a voltage VH for driving the magnetic head is supplied via a transistor 39 to the center tap of the winding 31 of the magnetic head.

In addition, the write control signal DATA supplied by the circuit of FIG. 3 is given to bases of transistors 40 and 41, while the inverted write control signal *DATA is given to bases of transistors 42 and 43.

Therefore, when the write control signal DATA is the high level (i.e., when the inverted write control signal *DATA is the low level), the transistors 40 and 41 are turned on, while the transistors 42 and 43 are turned off. As a result, the current that flows from the power source (the voltage VH) to the center tap of the winding 31 via the transistor 39 flows only half portion 31a of the winding 31 (the left portion in FIG. 4). The current flows through the transistor 40, the resistor 44 and the transistor 38 back to the ground, and flows through the transistor 41 and the resistor 45 back to the ground. The resistors 44 and 45 are current limiters.

On the contrary, when the inverted write control signal *DATA is the high level (i.e., when the write control signal DATA is the low level), the transistors 42 and 43 are turned on, while the transistors 40 and 41 are turned off. Therefore, the current that flows from the high voltage power source (the voltage VH) to the center tap of the winding 31 via the transistor 39 flows only half portion 31b of the winding 31 (the right portion in FIG. 4). The current flows through the transistor 42, the resistor 44 and the transistor 38 back to the ground, and flows through the transistor 43 and the resistor 45 back to the ground.

As explained above, the current flows in the center tap of the winding 31 changes its direction in the winding 31 depending on whether the write control signal DATA is the low level or the high level, so that the magnetic field generated by the winding changes its polarity. In FIG. 4, the current and the magnetic field when the write control signal DATA is the high level (when the inverted write control signal *DATA is the low level) are indicated in the positive polarity (direction).

In addition, since the current that flows through the half portion 31a or 31b of the winding 31 flows through two current paths connected in parallel back to the ground, the capacity of driving the current is sufficient for high speed switching.

Next, the operation will be explained for when the magnetizing control signal MAGCH is the high level, i.e., when there is no magnetic reversal during the three-write-clock period. In this case, the transistors 37 and 38 are turned off since the bases of the transistors 37 and 38 are supplied with the inverted signal of the magnetizing control signal MAGCH by the inverter 36. Therefore, the transistor 39 is turned off too, so that the current path from the high voltage power source (the voltage VH) to the center tap of the winding 31 is cut off. In addition, the current path including the resistor 44 and the transistor 38 to the ground is also cut off.

In contrast, the output of the AND gate 32 whose input signals are the magnetizing control signal MAGCH and the write control signal DATA becomes the high level during the period while the write control signal DATA is the high level. In addition, the output of the AND gate 33 whose input signals are the magnetizing control signal MAGCH and the inverted write control signal *DATA becomes the high level during the period while the inverted write control signal *DATA is the high level (while the write control signal DATA is the low level).

When the output of the AND gate 32 is the high level (when the write control signal DATA is the high level), the transistor 34 and the transistor 46 are turned on. As a result, the current flows from the low voltage power source (the voltage VL) to the winding 31 (31b) via the transistor 46 and the diode 47. This current flows through the entire winding 31 (31b and 31a), transistor 41 that is turned on by the write control signal DATA and the resistor 45 back to the ground.

In addition, when the output of the AND gate 33 is the high level (when the write control signal DATA is the low level), the transistor 35 and the transistor 48 are turned on. As a result, the current flows from the low voltage power source (the voltage VL) to the winding 31 (31a) via the transistor 48 and the diode 49. This current flows the entire winding 31 (31a and 31b), the transistor 43 that is turned on by the inverted write control signal *DATA and the resistor 45 back to the ground. As explained above, when the magnetizing control signal MAGCH is the high level, i.e., when there is no magnetic reversal during the three-write-clock period, the current path from the high voltage power source (the voltage VH) to the center tap of the winding 31 is cut off, so that the bifilar driving is not performed. Instead, the entire winding 31 is supplied with the current from the low voltage power source (the voltage VL).

As shown in the signal waveforms of FIG. 5, assuming that the peak current that flows the half of the winding 31 (31a or 31b) by the bifilar driving when there is a magnetic reversal is I, the current that flows the entire winding 31 (31a and 31b) when there is no magnetic reversal can be ½. Thus, the current when there is no magnetic reversal can be reduced to a half compared with the conventional method in which the half portion of the winding 31 is magnetized even when there is no magnetic reversal. For example, if the voltage VL of the low voltage power source is set to one third of the voltage VH of the high voltage power source, the power consumption during a period while there is no magnetic reversal can be reduced to one sixth (½×⅓).

As explained above, the total quantity of the magnetic flux does not change substantially when the winding to be magnetized is changed, so that a high level of counter voltage (a transient voltage) is not generated between the winding ends. If the product (ampere-turn) of the magnetizing current and the winding number is constant, the total quantity of the magnetic flux is substantially constant.

A random pattern was assumed for the drive circuit for the magnetic head shown in FIG. 3 and FIG. 4, and the ratio of the period of a low current mode (both winding drive mode) is calculated by a computer simulation. It was approximately 25%. In this case, the entire power consumption under the above-mentioned condition (current ratio is ½ and the voltage ratio is ⅓) is reduced to approximately 80% as shown in the following calculation.

(1−0.25)×1+0.25×½×⅓≈0.79

In addition, as shown in FIG. 3, the write control signal DATA (the inverted write control signal *DATA) for switching the magnetizing direction in accordance with the write data is generated by using the write data signal WTDATA2 that is delayed from the write data signal WTDATA1 by one write clock. Therefore, the switching of the current for switching the magnetizing direction is performed at the edge timing of the write data signal WTDATA2.

In addition, the switching from the bifilar drive to the both winding drive, i.e., the switching from the high voltage power source VH to the low voltage power source VL is performed at the edge timing of the write data signal WTDATA3, while the switching in the opposite direction is performed at the edge timing of the write data signal WTDATA1. As a result, the voltage applied to the winding is switched from the low voltage power source VL to the high voltage power source VH one clock before the magnetic reversal. It is possible to switch the voltage applied to the winding at the same timing as the magnetic reversal. However, by switching from the low voltage power source VL to the high voltage power source VH one write clock before the magnetic reversal as this embodiment, the high speed magnetic reversal becomes easier.

Second Embodiment

Figure 6:
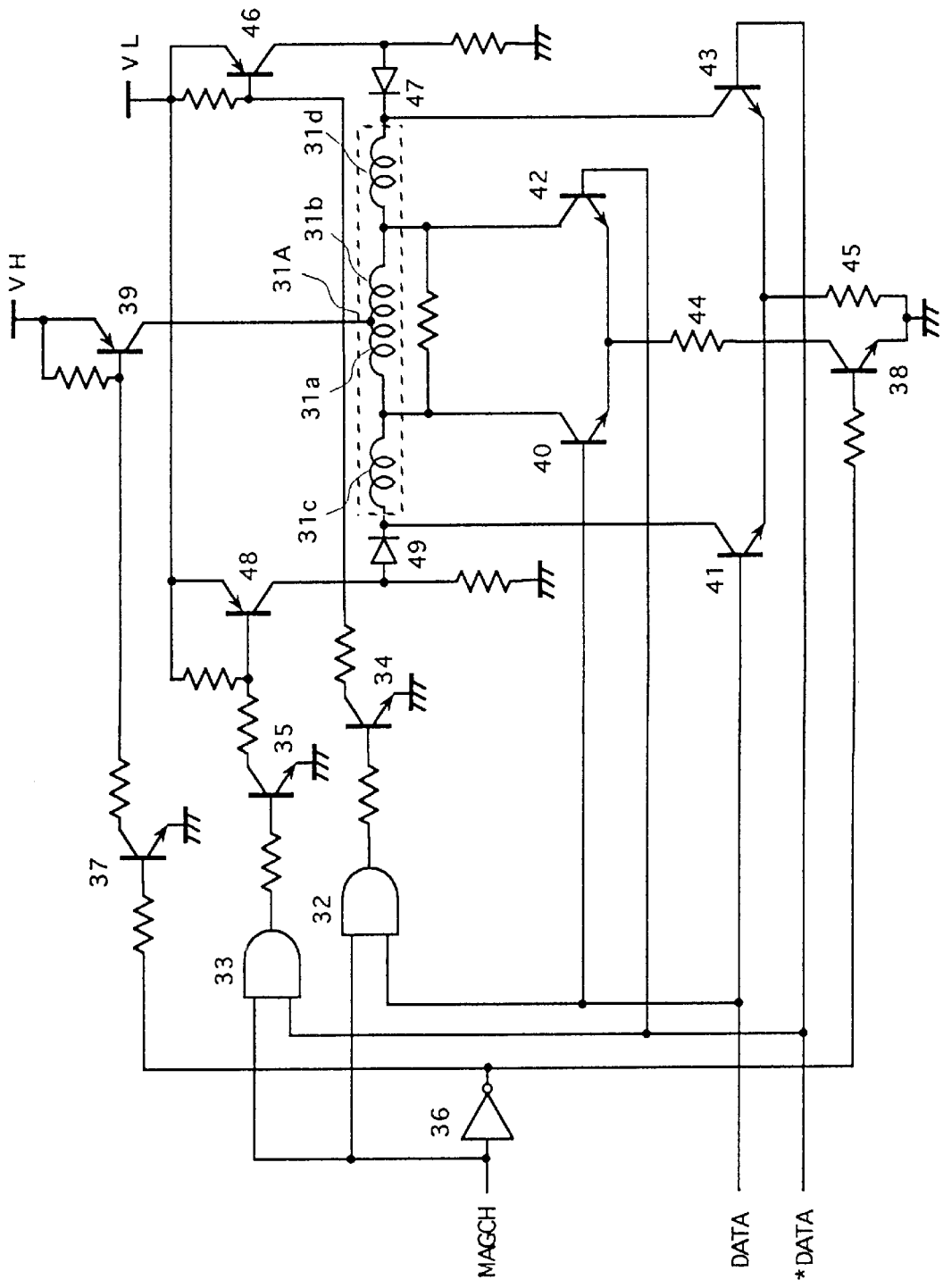
FIG. 6 shows a rear part of a drive circuit for the magnetic head according to a second embodiment of the present invention.

FIG. 6 shows a rear part of the drive circuit for the magnetic head according to a second embodiment of the present invention. The front part of the drive circuit is the same as the first embodiment shown in FIG. 3. The drive circuit of this embodiment shown in FIG. 6 drives a magnetic head (winding) 31A having another winding configuration different from the first embodiment shown in FIG. 4. In this embodiment, the magnetic head winding 31A has a bifilar winding 31a and 31b with a center tap and additional winding elements 31c and 31d connected to the outer taps of the bifilar winding 31a and 31b. In other words, the magnetic head winding 31A of this embodiment has four winding elements 31a–31d connected in series and three taps are drawn out from the three nodes of the four winding elements. The other circuit configuration is the same as the drive circuit shown in FIG. 4, so the same reference numerals as in FIG. 4 are used for indicating the elements in FIG. 6.

In the circuit of FIG. 6, the transistors 40 and 42 are connected to the outer terminal (tap) of the winding element 31a or the winding element 31b in the same way as the circuit of FIG. 4, while the transistors 41 and 43 are connected to the outer terminal of the winding element 31c or the winding element 31d. Thus, the power consumption during the period without the magnetic reversal can be reduced further.

During the period without the magnetic reversal, the magnetizing control signal MAGCH is the high level, so the transistors 37 and 39 are turned off, and the current path from the high voltage power source VH to the center tap of the winding 31A is cut off. In addition, the transistor 38 is also turned off, so that the current path from the transistor 40 or 42 to the ground via the resistor 44 and the transistor 38 is also cut off. A pair of the transistors 46 and 41 or a pair of the transistors 48 and 43 is turned on depending on whether the write control signal DATA is the high level or the low level. As a result, the magnetizing current flows through the entire winding 31A of the magnetic head, i.e., the all winding elements 31a–31d. Assuming that the four winding elements 31a–31d have the same winding number, the current required for obtaining the same magnetic flux (ampere-turn) can be reduced to ¼ compared with the case where only one of the four winding elements 31a–31d is magnetized.

When the magnetic reversal appears, the magnetizing control signal MAGCH becomes the low level, and the transistors 37, 38 and 39 are turned on so that the current flows from the high voltage power source VH to the center tap of the winding 31A via the transistor 39. This current flows through the winding element 31a or 31b depending on whether the write control signal DATA is the high level or the low level, and through the transistor 40 or 42, the resistor 44 and transistor 38 back to the ground.

A part of the current flowing through the winding element 31a or 31b flows through the winding element 31c or 31d, the transistor 41 or 43 and the resistor 45 back to the ground. Thus, when the magnetic reversal appears, the bifilar drive of the winding 31A of the magnetic head is performed by using the parallel current path that is basically the same as the circuit of FIG. 4, but is a little modified.

Third Embodiment

Figure 7:
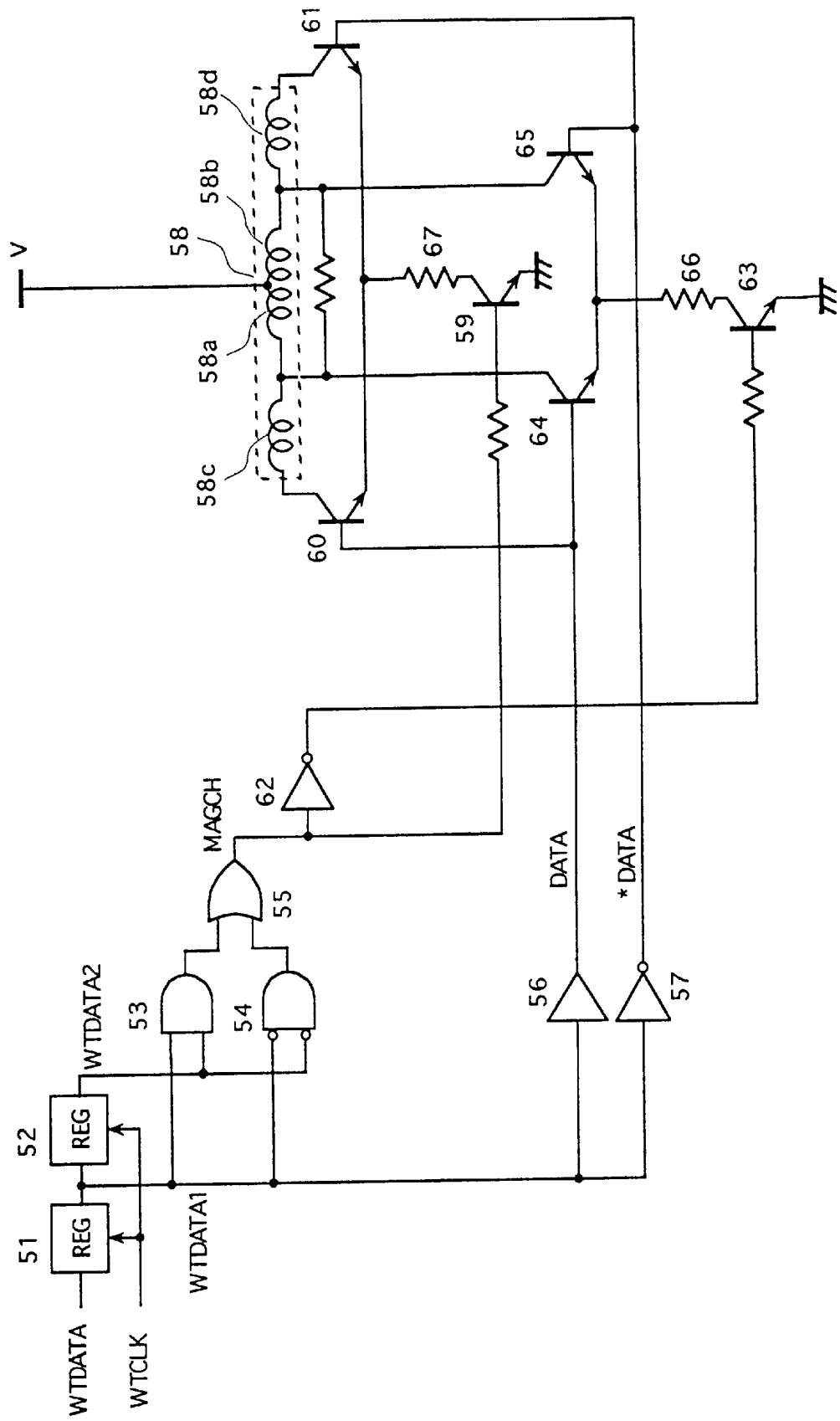
FIG. 7 shows a drive circuit for the magnetic head according to a third embodiment of the present invention.
Figure 8:
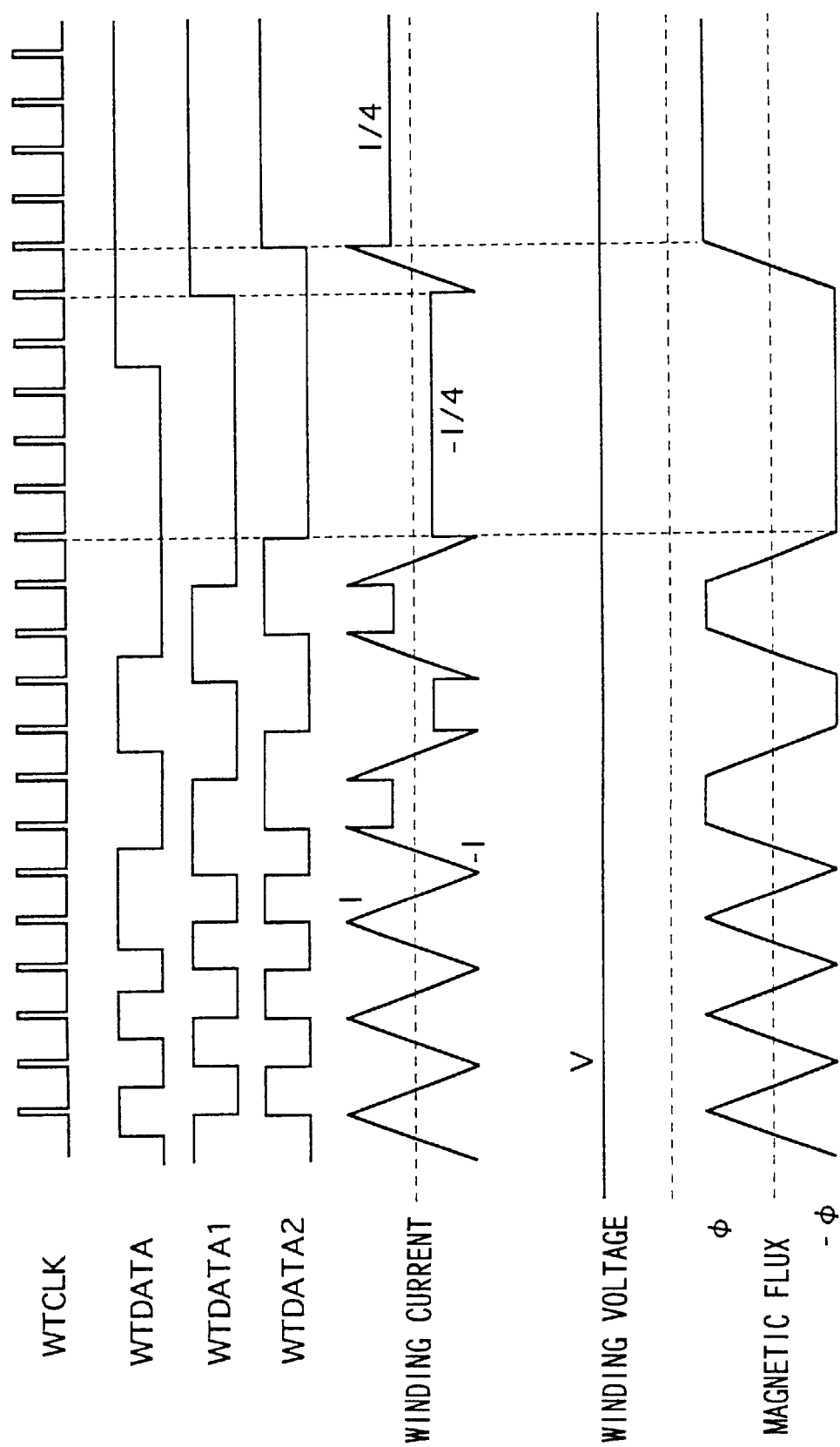
FIG. 8 shows waveforms of the signals in the drive circuit for the magnetic head according to the third embodiment of the present invention.

FIG. 7 is a circuit diagram of the drive circuit for the magnetic head according to a third embodiment of the present invention. FIG. 8 shows signal waveforms in this drive circuit for the magnetic head. In FIG. 7, two registers 51 and 52 are used for generating write data signals WTDATA1 and WTDATA2 for a two-write-clock period in synchronization with the write clock WTCLK. An AND gate 53 generates an AND signal of the write data signals WTDATA1 and WTDATA2, while an AND gate 54 generates an AND signal of the inverted signals of the write data signals WTDATA1 and WTDATA2.

An OR gate 55 performs OR operation of the output signals of the AND gate 53 and the AND gate 54, and the result is outputted as the magnetizing control signal MAGCH indicating the presence or absence of the magnetic reversal. Therefore, the magnetizing control signal MAGCH is the high level when the write data WTDATA keeps the high level or the low level during the two-write-clock period, otherwise the signal MAGCH is the low level. The signal MAGCH indicates the absence of the magnetic reversal by its high level and indicates the presence of the magnetic reversal by its low level. Though three registers are used in the first and the second embodiments (as shown in FIG. 3) for detecting the presence or absence of the magnetic reversal during the three-write-clock period, this embodiment checks the presence or absence of the magnetic reversal during the two-write-clock period. In this embodiment, the voltage applied to the winding is not switched. This embodiment performs the switching between the normal mode and the low current mode in accordance with the presence or absence of the magnetic reversal and the magnetic reversal in accordance with the write data simultaneously.

The write data WTDATA2 is outputted as the write control signal DATA via a buffer 56, and is inverted by the inverter 57 to be an inverted write control signal *DATA.

The winding 58 of the magnetic head in this embodiment has a winding configuration that is the same as the second embodiment, in which four winding elements 58a–58d are connected in series and three taps are drawn out of the three nodes of the four winding elements 58a–58d. However, the driving method is different.

First, when the magnetizing control signal MAGCH is the low level, i.e., when there is a magnetic reversal during the two-write-clock period, a transistor 59 is turned off, so the current cannot flow through the outer pair of winding elements 58c and 58d of the winding 58 despite of the state of the transistors 60 and 61.

A transistor 63 is turned on since the base of the transistor 63 is supplied with the inverted signal of the magnetizing control signal MAGCH by the inverter 62. In addition, a transistor 64 or 65 is turned on depending on whether the write control signal DATA (the inverted write control signal *DATA) is the high level or the low level. Consequently, the current from the power source (the voltage V) to the center tap of the winding 58 flows through the winding element 58a or 58b, the transistor 64 or 65, a current limiting resistor 66 and the transistor 63 back to the ground. Thus, the inner winding elements 58a and 58b of the winding 58 are used for the bifilar drive.

Next, when the magnetizing control signal MAGCH is the high level, i.e., when there is no magnetic reversal during the two-write-clock period, the transistor 59 is turned on. The transistor 63 is turned off since the inverted signal of the magnetizing control signal MAGCH is given to the base of the transistor 63 by the inverter 62. Therefore, the current path having the transistor 64 or 65, the resistor 66 and the transistor 63 to the ground is cut off. In addition, the transistor 60 or 61 is turned on depending on whether the write control signal DATA (the inverted write control signal *DATA) is the high level or the low level. As a result, the current from the power source (the voltage V) to the center tap of the winding 58 flows the winding element 58a and 58c, or the winding element 58b and 58d, the transistor 60 or 61 and the current limiting resistor 67 back to the ground.

As explained above, in this embodiment, the current flow into the center tap of the magnetic head winding 58 even in the low current mode in which there is no magnetic reversal. However, the magnetizing current flow not only through the inner winding elements 58a, 58b but also through the outer winding elements 58c, 58d, so the effect of reducing the current can be obtained. For example, assuming that the ratio of the winding number of the inner winding elements 58a, 58b and the outer winding elements 58c, 58d is 1:3, the current required for obtaining the same magnetic flux (ampere-turn) can be reduced to ¼ by magnetizing both the inner and outer winding elements compared with the case where only the inner winding elements are magnetized.

In addition, the drive circuit of this embodiment does not need the switching of the power source voltage, so that the switching of the normal mode and the low current mode in accordance with the presence or absence of the magnetic reversal can be performed in the same timing as the magnetic reversal in accordance with the write data. Thus, the period of the low current mode can be set relatively long. This state will be understood by comparing the waveform of the winding current in FIG. 8 with that in FIG. 5. Though the ratio of the period of the low current mode is approximately 25% in the first embodiment as a result of a simulation assuming a random pattern, the ratio will be up to approximately 50% in this embodiment. In this case, the total power consumption can be reduced to approximately 62.5% under the above-mentioned condition (the current ratio is ¼) as shown in the following calculation.

$$(1-0.5) \times 1 + 0.5 \times \frac{1}{4} \approx 0.625$$

Fourth Embodiment

Figure 9:
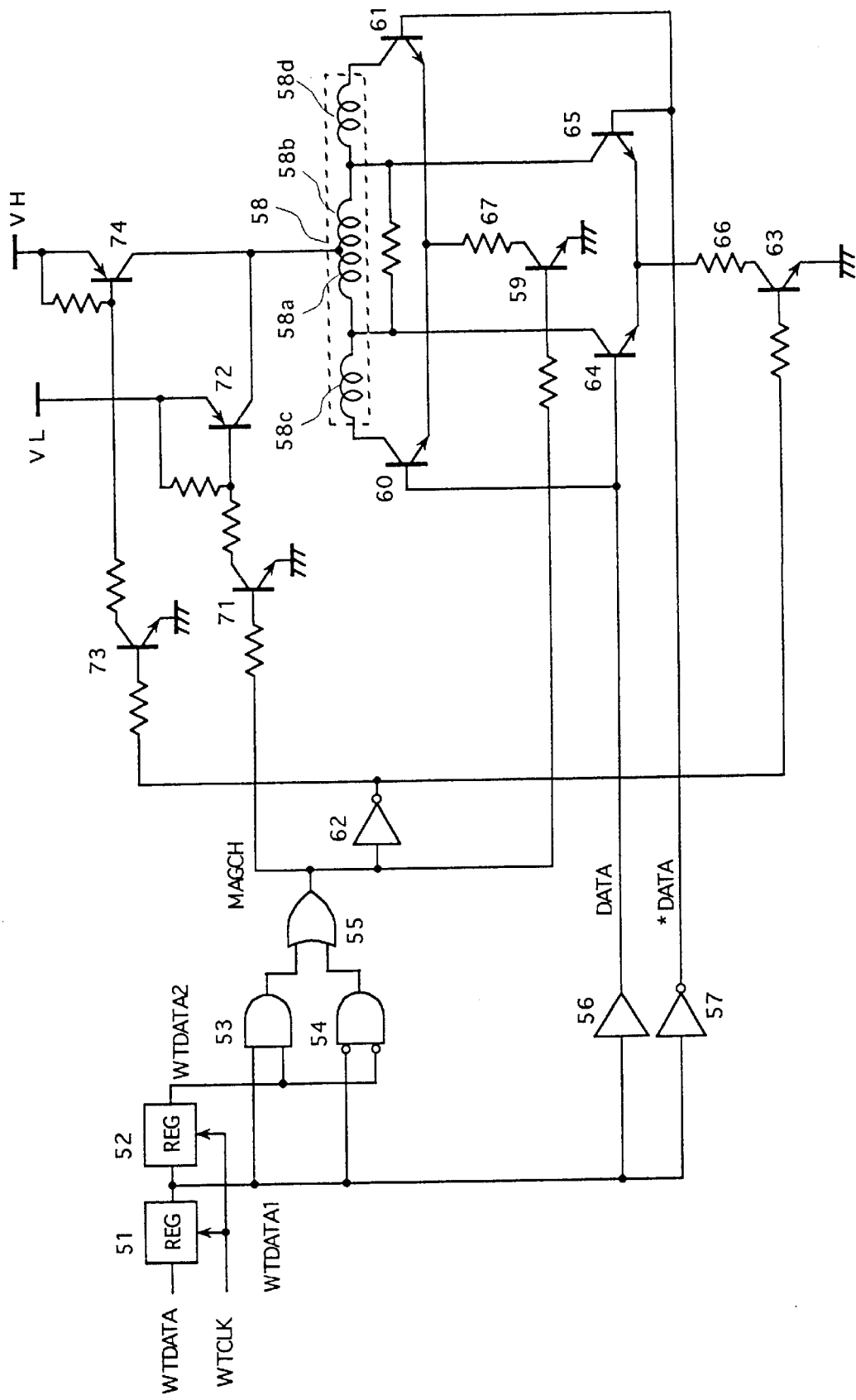
FIG. 9 shows a drive circuit for the magnetic head according to a fourth embodiment of the present invention.

FIG. 9 is a circuit diagram of the drive circuit for the magnetic head according to a fourth embodiment of the present invention. This embodiment has a voltage switching circuit adding to the drive circuit of the third embodiment. Namely, the voltage switching circuit including four transistors 71–74 switches the voltage to be applied to the center tap of the winding 58 of the magnetic head between the high voltage VH and the low voltage VL. Other circuit configuration is the same as the drive circuit of the third embodiment shown in FIG. 7, so the same reference numerals as in FIG. 7 are used for indicating the elements in FIG. 9.

In FIG. 9, if the magnetizing control signal MAGCH is the low level, i.e., if there is a magnetic reversal during two-write-clock period, the transistors 71 and 72 are turned off, and the transistors 73 and 74 are turned on. Therefore, the center tap of the winding 58 is supplied with the high voltage VH via the transistor 74.

In contrast, if the magnetizing control signal MAGCH is the high level, i.e., if there is no magnetic reversal during two-write-clock period, the transistors 73 and 74 are turned off, and the transistors 71 and 72 are turned on. Therefore, the center tap of the winding 58 is supplied with the low voltage VL via the transistor 74.

According to this embodiment, adding to the same effect of saving the power consumption as in the third embodiment, the power consumption is further reduced by switching the voltage applied to the winding to the low voltage VL when the magnetic reversal does not appear.

Fifth Embodiment

Figure 10:
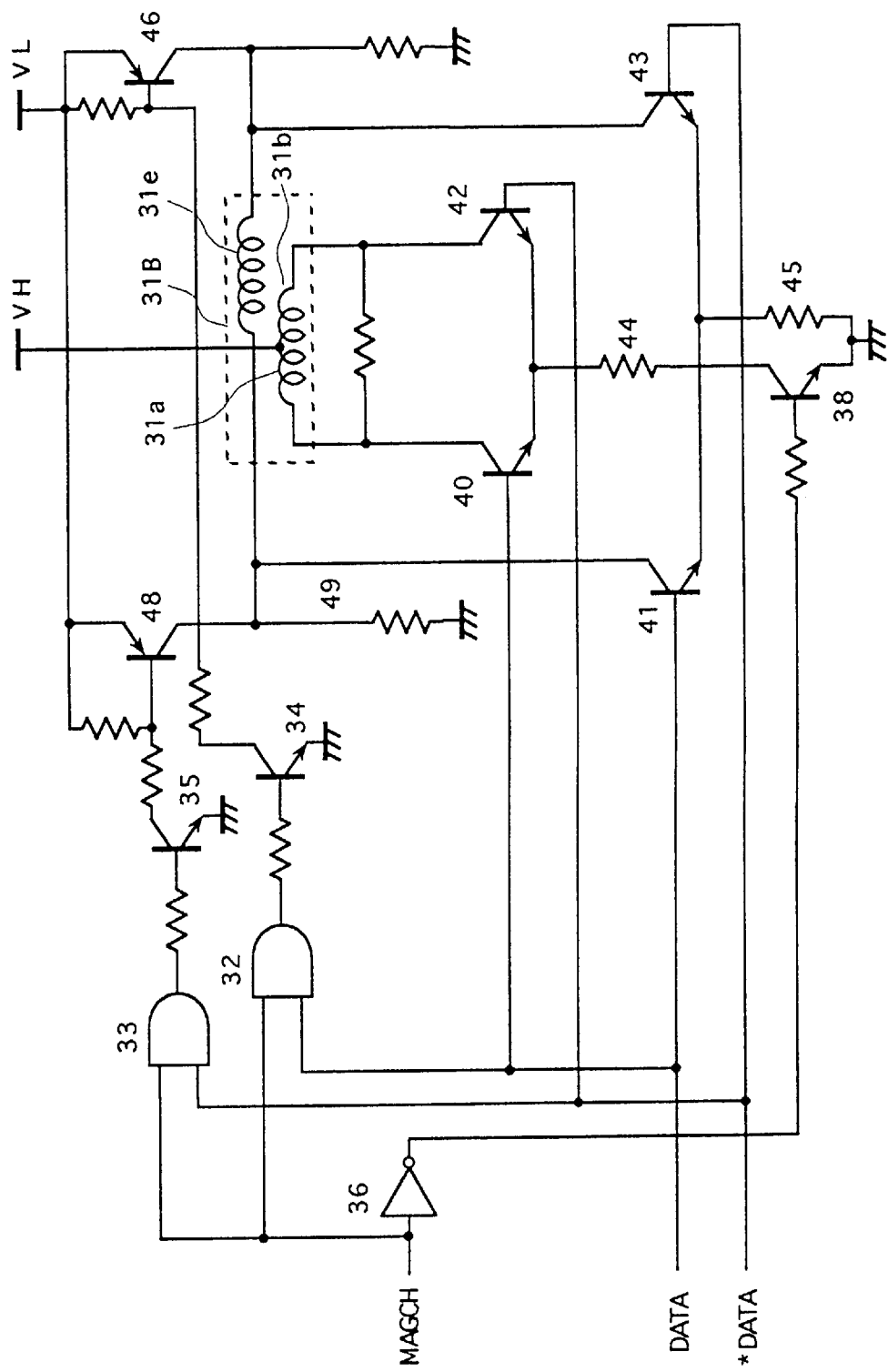
FIG. 10 shows a drive circuit for the magnetic head according to a fifth embodiment of the present invention.

FIG. 10 shows a rear part of the drive circuit for the magnetic head according to a fifth embodiment of the present invention. The front part of the drive circuit is the same as the first embodiment shown in FIG. 3. The drive circuit of this embodiment shown in FIG. 10 drives a magnetic head (winding) 31B having another winding configuration different from the first embodiment shown in FIG. 4. In addition, the circuit constituting the current path is a little different. The other circuit configuration is the same as the drive circuit shown in FIG. 4, so the same reference numerals as in FIG. 4 are used for indicating the elements in FIG. 10.

The winding 31B of the magnetic head in this embodiment has a bifilar winding 31a and 31b with a center tap and an additional winding element 31e that is separate from the bifilar winding 31a and 31b. The connection node (center tap) of the bifilar winding 31a and 31b is connected to the high voltage power source VH directly. One of the ends of the separate winding element 31e is connected to the collector of a PNP transistor 48 and the collector of a NPN transistor 41. The other end of the separate winding element 31e is connected to the collector of a PNP transistor 46 and the collector of a NPN transistor 43.

In FIG. 10, if the magnetizing control signal MAGCH is the low level, i.e., if there is a magnetic reversal, the outputs of the AND gates 32 and 33 are both the low level, so the transistors 34 and 35 are both turned off. As a result, the transistors 46 and 48 are also turned off, so that the current supplying path from the low voltage power source VL to the separate winding element 31e of the winding 31B is cut off.

The transistor 38 is turned on since the inverted signal of the magnetizing control signal MAGCH is supplied to the base of the transistor 38 by the inverter 36. In addition, the transistor 40 or 42 is turned on depending on whether the write control signal DATA (the inverted write control signal *DATA) is the high level or the low level. As a result, the current supplied from the high voltage power source VH to the center tap of the bifilar winding 31a and 31b of the winding 31B flows the winding element 31a or 31b, the transistor 40 or 42, the resistor 44 and the transistor 38 beck to the ground.

Next, if the magnetizing control signal MAGCH is the high level, i.e., if there is no magnetic reversal, the transistor 38 turned off, so the current path including the transistor 40 or 42, the resistor 44, and the transistor 38 to the ground is cut off. As a result, the current does not flow through the bifilar winding 31a and 31b of the winding 31B.

One of the outputs of the AND gates 32 and 33 becomes the high level in accordance with whether the write control signal DATA (the inverted write control signal *DATA) is the high level or the low level.

For example, if the write control signal DATA is the high level (if the inverted write control signal *DATA is the low level), the AND gate 32 is turned on, and the AND gate 33 is turned off. As a result, the transistors 34 and 46 are turned on, so that the magnetizing current is supplied from the low voltage power source VL to the separate winding element 31e of the winding 31B via the transistor 46. Since the transistor 41 is also turned on by the write control signal DATA, the magnetizing current after flowing through the separate winding element 31e flows the transistor 41 and the resistor 45 back to the ground.

In contrast, if the write control signal DATA is the low level (the inverted write control signal *DATA is the high level), the AND gate 33 is turned on, and the AND gate 32 is turned off. As a result, the transistors 35 and 48 are turned on, the magnetizing current in the opposite direction is supplied from the low voltage power source VL to the separate winding element 31e of the winding 31B via the transistor 48. Since the transistor 43 is also turned on by the inverted write control signal *DATA, the magnetizing current after flowing through the separate winding element 31e flows the transistor 43 and the resistor 45 back to the ground.

In this embodiment, the separate winding element 31e is added to the bifilar winding 31a and 31b of the winding 31B of the magnetic head so as to perform high speed magnetic reversal. During a period having no magnetic reversal, the magnetizing current flows through the separate winding element 31e. Therefore, if the winding number of the separate winding element 31e is set larger than the winding number of the winding element 31a or 31b, an equivalent magnetic flux quantity (ampere-turn) can be obtained by a small magnetizing current. In addition, since the separate winding element 31e is supplied with the voltage VL lower than the voltage VH that is applied to the bifilar winding 31a and 31b, the power consumption during the period having no magnetic reversal (the period of the low current mode) can be further reduced.

Though it is explained to save the power consumption when writing data on the recording medium in each embodiment explained above, the drive circuit for the magnetic head and the winding configuration of the magnetic head according to the present invention can obtain the effect of the power consumption when reading data too.

For example, it is necessary to apply a constant magnetic field to the recording medium when reading data from the magnetic super resolution (MSR) magneto-optical disk as shown in Japanese unexamined patent publication No. 2-244877. In this case, the current flowing the winding of the magnetic head can be reduced and preferably the applied voltage can be lowered, so that the power consumption can be reduced according to the present invention. The control signal indicating the read mode or the write mode can be used for switching the normal mode and the low current mode, instead of the magnetizing control signal MAGCH in each embodiment explained above. In addition, since the direction of the magnetizing current in the low current mode (the read mode) is fixed, the circuit configuration can be more simplified.

As explained above, the drive circuit for the magnetic head and the winding configuration of the magnetic head according to the present invention can reduce the magnetizing current during a period having no magnetic reversal, so that the entire power consumption can be substantially reduced. In addition, adopting the method of lowering the voltage applied to the winding of the magnetic head during the period having no magnetic reversal, the power consumption can be further reduced.

What is claimed is:

1. A drive circuit for a magnetic head that has a bifilar winding with a center tap and is used for a magneto-optical disk drive, wherein the drive circuit applies a first magnetizing voltage between the center tap and one of the winding ends of the bifilar winding so as to magnetize only half of the winding during a first period in which a magnetic reversal occurs in write data, and applies a second magnetizing voltage between the winding ends of the bifilar winding so as to magnetize the entire winding during a second period in which a magnetic reversal does not occur in write data.

2. The drive circuit according to claim 1, wherein the second magnetizing voltage applied to the winding ends of the bifilar winding during the second period is set lower than the first magnetizing voltage applied to the center tap and one of the winding ends of the bifilar winding during the first period.

3. The drive circuit according to claim 2, wherein the switching from the second magnetizing voltage to the first magnetizing voltage is performed before the magnetic reversal.

4. The drive circuit according to claim 1, wherein each of the winding ends of the bifilar winding is connected to a magnetizing current path that includes two current paths connected in parallel, each of the two current paths has a switching device, and the switching devices are controlled so that the magnetizing current can flow through the two current paths during the first period in which a magnetic reversal occurs and can flow through one of the two current paths during the second period in which a magnetic reversal does not occur.

5. A drive circuit for a magnetic head that has a bifilar winding with a center tap and is used for a magneto-optical disk drive, wherein the drive circuit applies a first magnetizing voltage between the center tap and one of the winding ends of the bifilar winding so as to magnetize only half of the winding during the data writing period with a magnetic reversal, and applies second magnetizing voltage between the winding ends of the bifilar winding so as to magnetize the entire winding during the data reading period.

6. A winding configuration of a magnetic head that has a bifilar winding with a center tap and is used for a magneto-optical disk drive, wherein an additional winding element is connected to each of the winding ends of the bifilar winding, so that four winding elements and five taps including the center tap and two end taps constitute the whole winding of the magnetic head.

7. A drive circuit for a magnetic head having an inner bifilar winding with a center tap and additional outer winding elements connected to the winding ends of the inner bifilar winding, wherein the drive circuit magnetizes only the inner bifilar winding of the magnetic head during a first period in which a magnetic reversal occurs, and magnetizes the entire winding including the additional outer winding elements of the magnetic head during a second period in which a magnetic reversal does not occur.

8. The drive circuit according to claim 7, wherein a second magnetizing voltage applied to the inner bifilar winding and the additional outer winding elements of the magnetic head during the second period is set lower than a first magnetizing voltage applied to the inner bifilar winding of the magnetic head during the first period.

9. The drive circuit according to claim 8, wherein the switching from the second magnetizing voltage to the first magnetizing voltage is performed before the magnetic reversal.

10. A drive circuit for a magnetic head having an inner bifilar winding with a center tap and additional outer winding elements connected to the winding ends of the inner bifilar winding, wherein the drive circuit magnetizes only the inner bifilar winding during the data writing period with a magnetic reversal, and magnetizes the entire winding including the additional outer winding elements during the data reading period.

11. A winding configuration of a magnetic head that has a bifilar winding with a center tap and is used for a magneto-optical disk drive, wherein an additional winding is provided separately from the bifilar winding, and the number of turns of the additional winding is larger than that of half of the bifilar winding.

12. A drive circuit for a magnetic head having an inner bifilar winding with a center tap and additional separate winding whose number of turns is larger than that of half of the bifilar winding, wherein the drive circuit magnetizes the bifilar winding of the magnetic head during a first period in which a magnetic reversal occurs, and magnetizes the additional separate winding during a second period in which a magnetic reversal does not occur.

13. The drive circuit according to claim 12, wherein a second magnetizing voltage applied to the additional separate winding of the magnetic head during the second period is set lower than a first magnetizing voltage applied to the bifilar winding of the magnetic head during the first period.

14. The drive circuit according to claim 13, wherein the switching from the second magnetizing voltage to the first magnetizing voltage is performed before the magnetic reversal.

15. A drive circuit for a magnetic head having an inner bifilar winding with a center tap and an additional separate winding whose number of turns is larger than that of half of the bifilar winding, wherein the drive circuit magnetizes the bifilar winding of the magnetic head during the data writing period with a magnetic reversal, and magnetizes the additional separate winding during the data reading period.

16. A drive circuit for a magnetic head that has a bifilar winding with a center tap and is used for a magneto-optical disk drive, the drive circuit comprising:

a first drive circuit for magnetizing only half of the winding selectively by supplying a first magnetizing current between the center tap of the bifilar winding and one of the winding ends;

a second drive circuit for magnetizing the entire winding by supplying second magnetizing currents to the winding ends of the bifilar winding selectively, the second magnetizing currents being smaller than the first magnetizing current and having opposite directions from each other; and a circuit for controlling the first and the second drive circuits selectively in accordance with bit pattern of a binary signal to be recorded.

* * * * *